United States Patent
Floyd et al.

(10) Patent No.: US 9,654,983 B2
(45) Date of Patent: May 16, 2017

(54) TUNABLE FILTER EMPLOYING FEEDFORWARD CANCELLATION

(71) Applicant: North Carolina State University, Raleigh, NC (US)

(72) Inventors: Brian A. Floyd, Raleigh, NC (US); Charley Theodore Wilson, III, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 14/677,938

(22) Filed: Apr. 2, 2015

(65) Prior Publication Data

US 2015/0288392 A1   Oct. 8, 2015

Related U.S. Application Data

(60) Provisional application No. 61/974,517, filed on Apr. 3, 2014.

(51) Int. Cl.
*H04W 16/14* (2009.01)
*H03H 7/48* (2006.01)
(Continued)

(52) U.S. Cl.
CPC .............. *H04W 16/14* (2013.01); *H03H 7/48* (2013.01); *H03H 19/002* (2013.01);
(Continued)

(58) Field of Classification Search
CPC ........ G02B 27/10; H04B 15/00; H04B 1/123; H04B 1/0458; H04B 1/0475; H04B 1/16;
(Continued)

(56) References Cited

U.S. PATENT DOCUMENTS 3,681,697 A * 8/1972 Moroney ............. H03D 7/1408
455/302
5,303,418 A * 4/1994 Staudinger ........... H03D 7/1408
455/318
(Continued)

OTHER PUBLICATIONS

A. Mirzaei, H. Darabi, and D. Murphy, "Architectural evolution of integrated M-phase high-Q bandpass filters," IEEE Trans. Circuits and Systems-I, vol. 59, No. 1, Jan. 2012.
(Continued)

*Primary Examiner* — Emmanuel Bayard
(74) *Attorney, Agent, or Firm* — Jenkins, Wilson, Taylor & Hunt, P.A.

(57) ABSTRACT

Methods, systems, and computer readable media for a tunable filter employing feedforward cancellation are disclosed. According to one aspect, the subject matter described herein includes a tunable transmissive filter that includes a splitter for splitting an input signal into a first signal and a second signal, a first modifier circuit for modifying a characteristic of the first signal to produce a modified first signal, a second modifier circuit for using feedforward cancellation to modify a characteristic of the second signal to produce a modified second signal, the second modifier circuit including an N-path filter, N being an integer greater than 0; and a combiner for combining the modified first signal and the modified second signal to produce a filtered output signal having a bandpass response.

33 Claims, 7 Drawing Sheets

(51) Int. Cl.
*H03H 19/00* (2006.01)
*H03H 7/01* (2006.01)
*H03H 11/04* (2006.01)

(52) U.S. Cl.
CPC ..... *H03H 19/008* (2013.01); *H03H 2007/013* (2013.01); *H03H 2011/0488* (2013.01); *H03H 2240/00* (2013.01)

(58) Field of Classification Search
CPC ......... H04B 1/38; H04B 1/001; H04L 27/148; H04L 5/1461; H04L 25/03012
USPC .......................... 375/219–220, 297–298, 350
See application file for complete search history.

(56) References Cited

U.S. PATENT DOCUMENTS

| | | | | |
|---|---|---|---|---|
| 5,410,743 | A * | 4/1995 | Seely | H03D 7/18 327/113 |
| 5,512,963 | A * | 4/1996 | Mankovitz | G11B 27/107 348/705 |
| 6,020,783 | A * | 2/2000 | Coppola | H03D 7/161 327/552 |
| 6,029,059 | A * | 2/2000 | Bojer | H03D 7/1441 327/361 |
| 6,107,898 | A * | 8/2000 | Rauscher | H03F 3/602 333/166 |
| 6,343,211 | B1 * | 1/2002 | Thodesen | H03D 7/1441 455/305 |
| 6,714,775 | B1 * | 3/2004 | Miller | H04B 1/123 455/296 |
| 6,745,019 | B1 * | 6/2004 | Thodesen | H03D 7/1441 455/296 |
| 6,792,250 | B1 * | 9/2004 | Zarubin | H04B 17/14 327/105 |
| 6,917,815 | B2 * | 7/2005 | Hajimiri | H04B 1/005 455/285 |
| 6,934,341 | B2 * | 8/2005 | Sahlman | H03F 1/3229 330/151 |
| 7,085,122 | B2 | 8/2006 | Wu et al. | |
| 7,145,415 | B2 | 12/2006 | Sengupta et al. | |
| 7,345,557 | B2 * | 3/2008 | Podell | H01P 5/187 333/109 |
| 7,545,622 | B2 | 6/2009 | Morris, III et al. | |
| 7,561,009 | B2 | 7/2009 | Larson, III et al. | |
| 7,584,496 | B2 * | 9/2009 | Zinevitch | H04N 17/00 348/192 |
| 7,692,513 | B2 | 4/2010 | Yoshimoto | |
| 7,768,364 | B2 | 8/2010 | Hart et al. | |
| 8,314,653 | B1 * | 11/2012 | Granger-Jones | H03F 1/223 327/552 |
| 8,351,889 | B2 * | 1/2013 | Roussel | H04B 1/525 375/237 |
| 8,565,681 | B2 * | 10/2013 | Kim | H04B 1/525 455/296 |
| 8,666,347 | B2 | 3/2014 | Wilkerson et al. | |
| 9,020,065 | B2 * | 4/2015 | Wyville | H04B 1/0475 333/24 R |
| 9,042,847 | B2 | 5/2015 | Zhou | |
| 9,083,518 | B2 * | 7/2015 | Bauder | H03H 7/48 |
| 9,088,344 | B2 * | 7/2015 | Wyville | H03H 11/344 |
| 2006/0009172 | A1 * | 1/2006 | Shamsaifar | H03F 1/3223 455/114.2 |
| 2010/0148888 | A1 | 6/2010 | Hara et al. | |
| 2011/0065408 | A1 * | 3/2011 | Kenington | H04B 1/1036 455/303 |
| 2011/0122932 | A1 * | 5/2011 | Lovberg et al. | H04L 27/2039 375/219 |
| 2011/0227665 | A1 * | 9/2011 | Wyville | H03H 11/344 333/17.1 |
| 2012/0128350 | A1 * | 5/2012 | Popovic | G02B 6/12007 398/25 |
| 2014/0204808 | A1 * | 7/2014 | Choi | H04L 5/1461 370/278 |
| 2014/0273814 | A1 * | 9/2014 | Ralph | H03D 7/1425 455/12.1 |
| 2014/0323076 | A1 * | 10/2014 | Kintis | H04B 1/1036 455/307 |
| 2014/0376419 | A1 * | 12/2014 | Goel | H04B 1/525 370/278 |
| 2015/0078702 | A1 * | 3/2015 | Dorin | G02B 6/2766 385/3 |
| 2015/0094008 | A1 * | 4/2015 | Maxim | H01F 17/0013 455/245.1 |
| 2015/0099478 | A1 * | 4/2015 | Wyville | H03H 11/344 455/114.3 |
| 2015/0133068 | A1 * | 5/2015 | Aggarwal | H03H 19/002 455/176.1 |
| 2015/0155899 | A1 * | 6/2015 | Webb | H04B 1/126 455/303 |
| 2015/0194884 | A1 * | 7/2015 | Levesque | H03F 3/193 375/297 |
| 2015/0208137 | A1 * | 7/2015 | Alrutz | H04N 21/64784 725/124 |
| 2015/0263782 | A1 * | 9/2015 | Wyville | H04B 1/62 375/285 |
| 2017/0070251 | A1 | 3/2017 | Floyd et al. | |

OTHER PUBLICATIONS

Bolton, J. 2011. "Mobile Device RF Front-End TAM analysis and forecast". CS ManTech Conference, May 16, 2011.
A. Mirzaei and H. Darabi, "Analysis of imperfections on performance of 4-phase passive-mixer-based high-Q bandpass filters in SAW-less receivers," IEEE Trans. Circuits and Systems-I, vol. 58, No. 5, pp. 879-892, May 2011.
A. Ghaffari, E. A. M. Klumperink, M. C. M. Soer, and B. Nauta, "Tunable high-Q N-path band-pass filters: modeling and verification," IEEE J. Solid-State Circuits, vol. 46, No. 5, pp. 998-1010, May 2011.
Sideco, F "Smartphones to account for majority of cellphone shipments in 2015" IHS iSupply report, 2011.
A. Natarajan, S. Reynolds, M.-D. Tsai, S. Nicolson, J.-H. C. Zhan, D. Kam, D. Liu, O. Huang, A. Valdes-Garcia, and B. A. Floyd, "A fully-integrated 16-element phased-array receiver in SiGe BiCMOS for 60-GHz communications." IEEE J. Solid-State Circuits, May 2011. vol. 46, No. 5, pp. 1059-1-75.
Gartner "Smartphone shipments up 42 per cent in Q3 2011" www.gartner.com.
C. Andrews and A. C. Molnar, "implications of passive mixer transparency for impedance matching and noise figure in passive mixer-first receivers," IEEE Trans. Circuits and Systems-I, vol. 57, No. 12, pp. 3092-3103, Dec. 2010.
Vye, D. "Perspectives on Mobile Device Front-end integration" MW Jour Sep. 12, 2010.
Werth "System design considerations for SAW-less front-ends at the example of GSM DCS1088" 53rd MidWest Symp Circ and Sys: 2010:664-7.
Navian Co. RF Device Module for Cellular 2009-2010 www.navian.co.jp.
Meeker, M "Internet Trends" Morgan Stanley Investor Conference, NY, Apr. 2010.
Mi, X., "MEMS tunable bandpass filter on high-k LTCC" 23rd Int. Conf MEMS 2010:787090.
Hu "A wide-tuning digitally controlled FBAR-based oscillator for frequency synthesis." Int Frog Cont Symp (FCS) 2010: 608-12.
Abouzied, A., "An integrated SAW-less narrowband RF front-end," 53rd Midwest Symp Cir and Sys 2010:664-7.
M. D. Tsai and A. Natarajan, "60GHz passive and active RF-path phase shifters in silicon," IEEE RFIC Symp. Dig. Papers, Jun. 2009, pp. 223-226.
Reines and Rebeiz "Cascadable RF MEMS switched capacitors for 0.1 to 2 GHz applications" Microwave Symp Digest 2009:1157-60.
B. Floyd, "A 16 to 18.8-GHz sub-integer-N frequency synthesizer for 60-GHz transceivers," IEEE J. Solid-State Circuits, vol. 43, No. 5, pp. 1076-1086, May 2008.

(56) References Cited

OTHER PUBLICATIONS

Darabi "A blocker filter technique for SAW-less wireless receivers" IEEE Solid State Circuits 2007(42):2766-73.
J. R. Long, "Monolithic transformers for silicon RF IC design," IEEE J. Solid-State Circuits, vol. 35, No. 9, pp. 1368-1382, Sep. 2000.
L. E. Franks and I. W. Sandberg, "An alternative approach to the realizations of network functions: The N-path filter" Bell Syst. Tech. J., pp. 1321-1350, 1960.
Kaskowitz, M. "Mobile Everywhere—how enriched mobile media is changing the IP landscape" http://www.design-reuse.com/webinar/intro/ infinitedge2, 2010.
"RF Filters, PAs, Antenna Switches & Tunability for Cellular Handsets," Yole Dëveloppement, pp. 1-16 (2012).
Mi et al., "MEMS Tunable Bandpass Filters on High-k LTCC," IEEE, pp. 787-790 (Copyright 2010).
Doherty et al., "A New High Efficiency Power Amplifier for Modulated Waves," Proceedings of the Institute of Radio Engineers, vol. 24, No. 9, pp. 1-20 (Sep. 1936).
Natarajan et al., "A Bidirectional RF-Combining 60GHz Phased-Array Front End," 2007 IEEE International Solid-State Circuits Conference, pp. 202-203, 597 (2007).
Hilbert, "Radio Frequency MEMS for Wireless Communications," IEEE Magazine Aug, pp. 68-74 (Aug. 2008).
Cross, "MEMS for secure RFID," Crebrex Technologies SBIR Phase II report, FCC11, https://www.sbir.gov/sbirsearch/detail/121049 (Jan. 2008).
Angier, R., "Tunable RF Filters: Pursuing the 'holy grail' of acoustic filter R&D," http://mwjournal/expertadvice/tunable$_{13}$ RF$_{13}$ fulters$_{13}$ pursuing$_{13}$ holy$_{13}$ grail$_{13}$ acoustic$_{13}$ filter$_{13}$ /RES$_{13}$ 125/ (Jun. 16, 2008).

\* cited by examiner

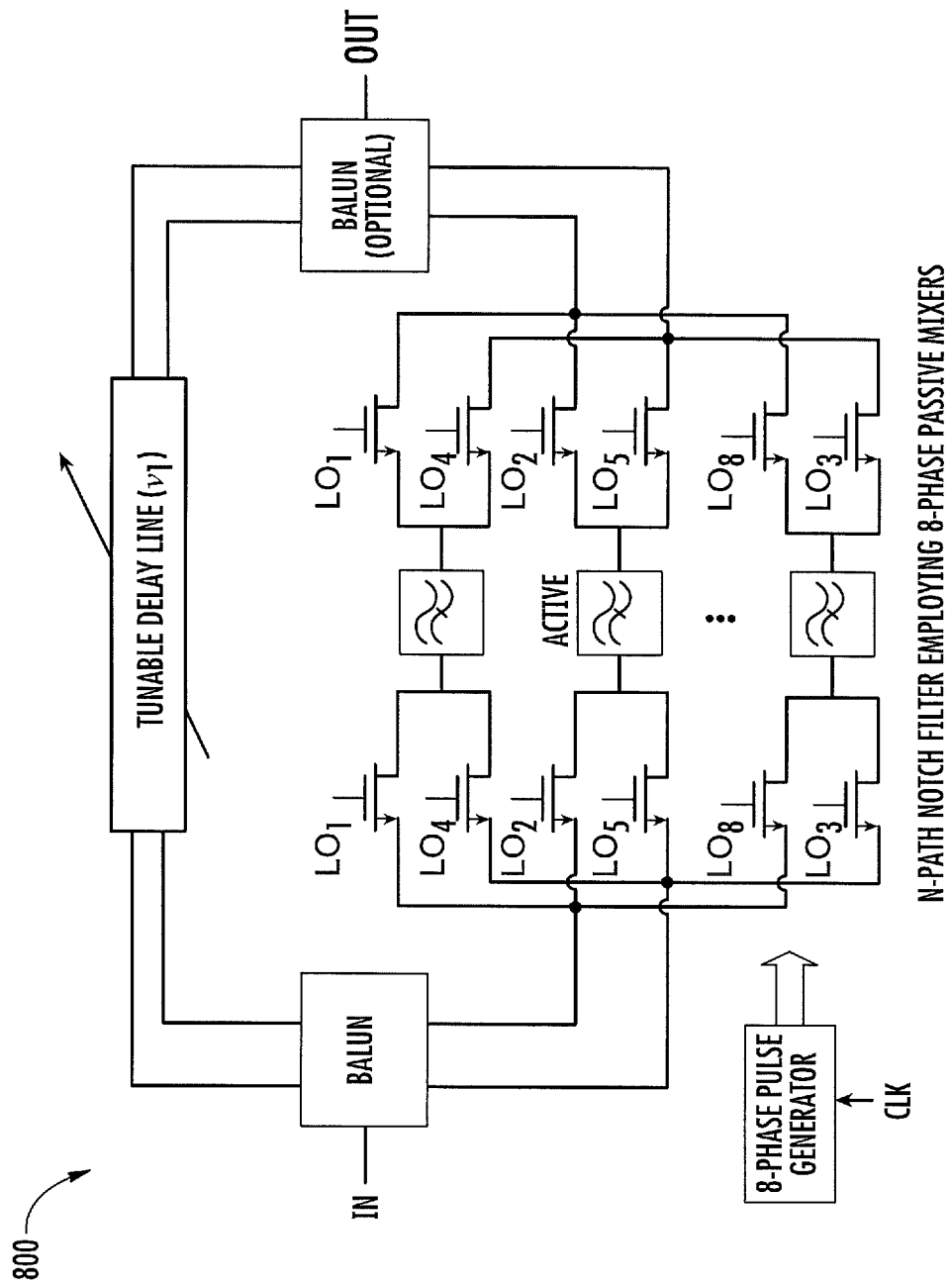

TUNABLE FILTER EMPLOYING FEEDFORWARD CANCELLATION

PRIORITY CLAIM

This application claims the priority benefit of U.S. Provisional Patent Application Ser. No. 61/974,517, filed Apr. 3, 2014; the disclosure of which is incorporated herein by reference in its entirety.

GOVERNMENT INTEREST

This invention was made with government support under Grant No. IIP 1216908 awarded by the National Science Foundation. The government has certain rights in the invention.

TECHNICAL FIELD

The subject matter described herein relates to methods and systems for tunable filters. More particularly, the subject matter described herein relates to tunable filters employing feedforward cancellation.

BACKGROUND

The FCC predicts that consumer demand for wireless bandwidth will exceed national capacity in less than two years [FCC11]. With Smartphone sales (200 million units in Q1 of 2013 [LIU13]) and their consumption of bandwidth accelerating, greater spectral efficiency is crucial. Multi-band Smartphones are projected to require up to a dozen channel filters by 2014, and rising thereafter, with the results that filter cost will soon be ~10× that of a feature phone [KAS10,YOL12]. The prospect of ever rising cost, complexity and space requirements in Smartphones has driven the search for an ultra-wideband tunable filter. To date, research has focused on MEMS or other switched filter banks and on tunable capacitors [WU06, HIL08, MOR09, REI09, MI10], but none have met all the criteria for commercial success. Without a cost effective ultra-wideband tuning technology free of distortion, utilization of spectrum will be inadequate, adversely affecting consumers, industry and the economy.

Accordingly, there exists a need for a cost effective ultra-wideband tuning technology free of distortion, and particularly for a tunable filter employing feedforward cancellation.

SUMMARY

According to one aspect, the subject matter described herein includes a tunable transmissive filter that includes a splitter for splitting an input signal into a first signal and a second signal; a first modifier circuit for modifying a characteristic of the first signal to produce a modified first signal; a second modifier circuit for using feedforward cancellation to modify a characteristic of the second signal to produce a modified second signal, the second modifier circuit including an N-path filter, N being an integer greater than 0, and the N-path filter having a desired frequency response (e.g., bandstop, bandpass, etc.); and a combiner for combining the modified first signal and the modified second signal to produce a filtered output signal having a bandpass response.

According to another aspect, the subject matter described herein includes a tunable reflective filter that includes: a first reflecting network comprising an N path terminated filter having a plurality of switching devices for selectively connecting an input to a load through at least one of a plurality of active termination devices, N being an integer greater than 0 and the N-path filter having a desired frequency response (e.g., bandstop, bandpass, etc.); a second reflecting network comprising either another N path terminated filter having a plurality of switching devices for selectively connecting an input to a load through at least one of a plurality of active termination devices, N being an integer greater than 0 and the N-path filter having a desired frequency response (e.g., bandstop, bandpass, etc.) or a tunable delay line having a first end and a second end, the second end being connected to a termination circuit for selectively terminating the second end of the delay line to an open circuit, to a short circuit to ground, or to an impedance to ground; and a coupler for coupling a filter input signal to the first end of the tunable delay line and to the input of the terminated filter and for coupling the first end of the tunable delay line and the input of the terminated filter to a filter output signal, wherein the coupler uses feedforward cancellation to combine a signal reflection from the delay line with a signal reflection from the terminated filter to produce a filtered output signal having a desired frequency response.

According to yet another aspect, the subject matter described herein includes a method for tunable transmissive filtering. The method includes splitting an input signal into a first signal and a second signal; modifying a characteristic of the first signal to produce a modified first signal; modifying a characteristic of the second signal to produce a modified second signal, including using an N-path filter, N being an integer greater than 0, and the N-path filter having a desired frequency response (e.g., bandstop, bandpass, etc.); and combining the modified first signal and the modified second signal to produce a filtered output signal having a bandpass response.

According to yet another aspect, the subject matter described herein includes a method for tunable reflective filtering. The method includes: providing a filter input signal to a first reflecting network comprising an N path terminated filter having a plurality of switching devices for selectively connecting an input to a load through at least one of a plurality of active termination devices, N being an integer greater than 0 and the N-path filter having a desired frequency response (e.g., bandstop, bandpass, etc.); providing the filter input signal to a second reflecting network comprising either another N path terminated filter having a plurality of switching devices for selectively connecting an input to a load through at least one of a plurality of active termination devices, N being an integer greater than 0 and the N-path filter having a desired frequency response (e.g., bandstop, bandpass, etc.) or a tunable delay line having a first end and a second end, the second end being connected to a termination circuit for selectively terminating the second end of the delay line to an open circuit, to a short circuit to ground, or to an impedance to ground; and combining a signal reflection from the first reflecting network with a signal reflection from the second reflecting network to produce a filtered output signal having a filter response.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Preferred embodiments of the subject matter described herein will now be explained with reference to the accompanying drawings, wherein like reference numerals represent like parts, of which:

FIG. 8 is a circuit diagram illustrating an AMBIR filter according to another embodiment of the subject matted described herein.

DETAILED DESCRIPTION

A universal channel selection filter for smartphones and other wireless mobile devices and radios. The analog filter technology illustrated herein is termed Adjustable Mixer-Based Interference Response (AMBIR) to reflect the fact that it exploits frequency translating mixers together with feedforward cancellation to realize a widely tunable filter which reduces the need for resonance-based filters in common use today. Exemplary principles of the AMBIR filter technology of wide tunability and frequency-translated filtering functions have been demonstrated through simulation and measurement. AMBIR is proposed as a new class of filter that enables a universal channel selector supporting spectrum efficiency in Smartphones and other reconfigurable platforms. As a CMOS circuit, AMBIR can provide the low size, weight, power and cost required of consumer wireless electronics, while also addressing military requirements for multi-band tuning.

Figure 1:
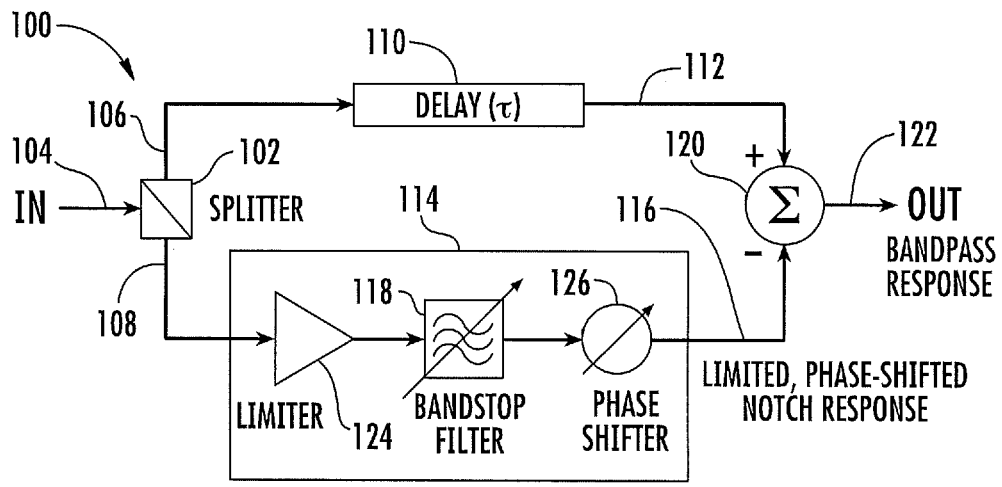
FIG. 1 is a circuit diagram illustrating Adjustable Mixer-Based Interference Response (AMBIR) filter topology using a response-inverted notch and delay line.

FIG. 1 is a circuit diagram illustrating AMBIR filter topology using response-inverted notch and delay line. The AMBIR filter is based on channel inversion and interference cancellation in the form of feed-forward cancellation [WIL12, VOS13] and mixer-based filter components.

In the embodiment illustrated in FIG. 1, filter 100 includes a splitter 102 for splitting an input signal 104 into a first signal 106 and a second signal 108. A first modifier circuit 110 modifies a characteristic of first signal 106 to produce a modified first signal 112. A second modifier circuit 114 modifies a characteristic of second signal 108 to produce a modified second signal 116. In one embodiment, second modifier circuit 114 includes N-path bandstop filter 118, N being an integer greater than 0. A combiner 120 combines modified first signal 112 and modified second signal 116 to produce a filtered output signal 122 having a bandpass response. In one embodiment, second modifier circuit 114 may include additional circuits, including but not limited to a limiter 124, such as a radio frequency (RF) limiter, a differential quadrature signal generator, and a phase shifter 126.

Figure 2:
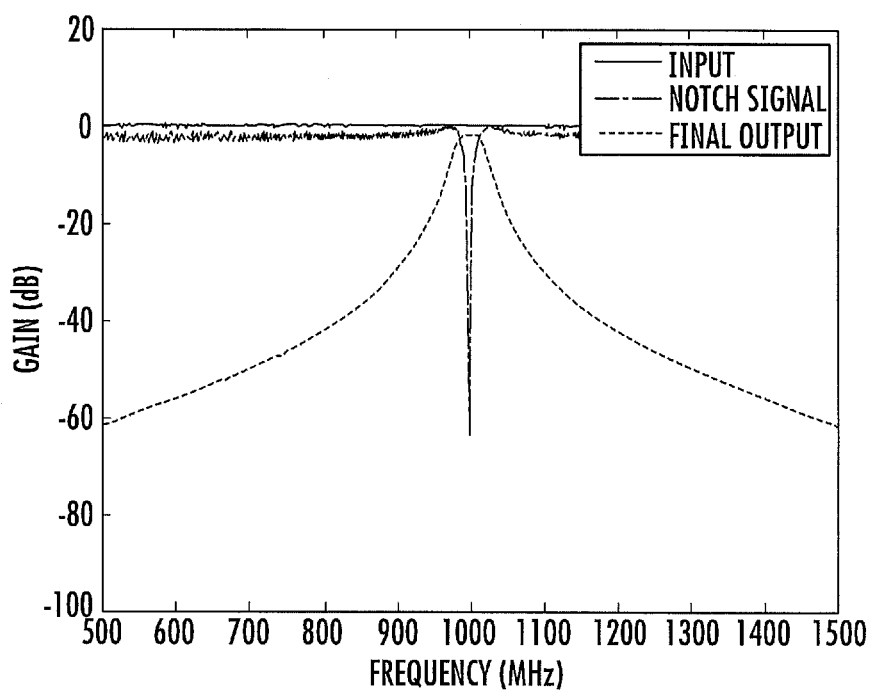
FIG. 2 is a graph showing an ideal bandpass response from the AMBIR filter.

FIG. 2 is a graph showing an ideal bandpass response from the AMBIR filter. The topology, shown in FIG. 1, inverts the response of a mixer-based notch filter by subtracting an active bandstop response from a passive all-pass response, shown in FIG. 2. Conventional tunable filter technologies are limited by loss, large tuning voltages or limited tuning ranges, and limited dynamic range. The filter proposed would attempt to overcome these challenges through the use of cancellation and channel inversion. The passband region of the overall filter response is derived from a passive delay line; therefore, it is not limited by active components. This allows for increased dynamic range and reduced noise from a standalone tunable bandpass filter.

AMBIR filter prototype. A proof-of-concept design was implemented to assess the feasibility of realizing a fully-integrated, single-chip AMBIR filter in low-cost CMOS technology for 0.7-3.0 GHz operation. The prototype was realized in 0.13-μm CMOS technology and included spiral transformers, a delay line, a phase shifter, an RF amplifier, an 8-path tunable notch filter, and an 8-phase clock generator. Here, we describe the first-generation circuit operation and highlight the simulated performance of the filter.

Figure 3:
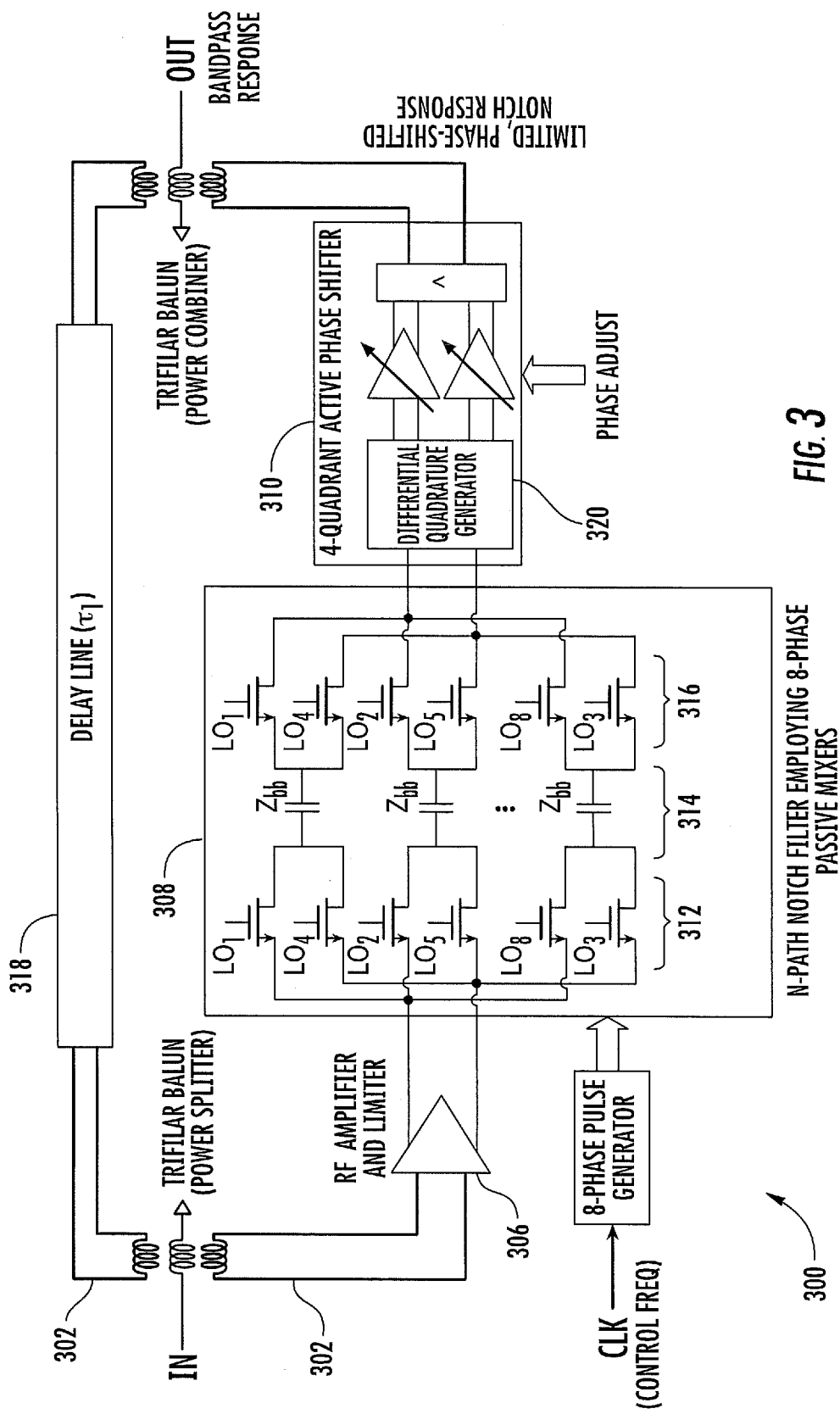
FIG. 3 is a circuit diagram illustrating a transmissive AMBIR filter according to an embodiment of the subject matter described herein.

FIG. 3 illustrates a block diagram of the prototype AMBIR filter according to an embodiment of the subject matter described herein. In the embodiment illustrated in FIG. 3, filter 300 receives an input signal IN. The input signal IN is split and directed to passive 302 and active 304 paths. A phase-shifted notch response in the active path is subtracted from the passive path to create a linearized bandpass response. The active path includes a limiting RF amplifier 306 which compensates for downstream loss and noise, an 8-path tunable notch filter 308, and a phase shifter 310. The N-path filter comprises an 8-phase passive mixer 312, a baseband high-pass filter 314, and another 8-phase passive mixer 316. As such, the notch filter is in fact a high-pass filter which has been up-converted to RF, wherein the local-oscillator (CLK) frequency controls the notch frequency. An exemplary benefit of N-path filtering is that wideband tuning can be achieved by adjusting the local-oscillator frequency, resulting in a filter which can cover 0.7-3.0 GHz and potentially replace most of the filters found in handset front-ends.

Figure 4:
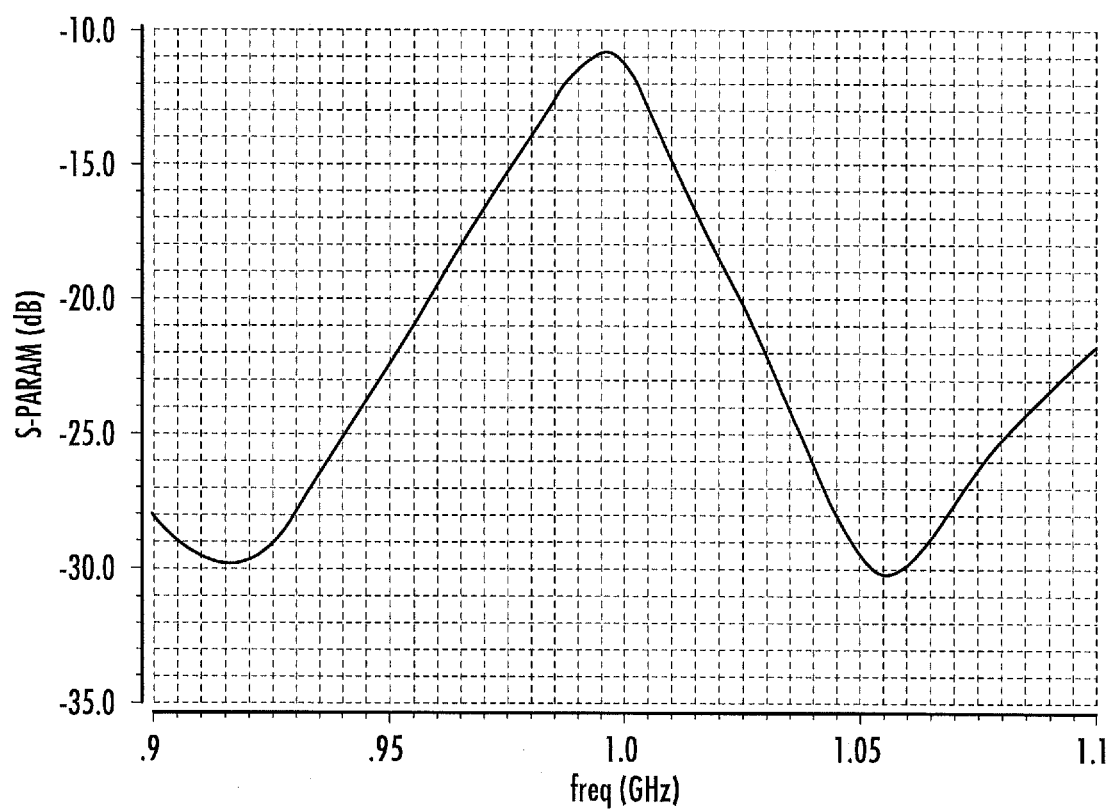
FIG. 4 is a graph showing the simulated transfer function of the filter shown in FIG. 3 when set for a 1 GHz center frequency when the active path is configured for cancellation at this frequency.

In the AMBIR filter, a type of feed-forward cancellation is used to invert the response of the 8-path tunable notch to obtain a linearized band-pass response. The in-band response is set by the passive path and the out-of-band response to be set by the matching between the two paths. As a result, the linearity of the N-path and the out-of-band rejection are both improved. To achieve good out-of-band rejection, the two paths should be amplitude- and delay-matched; hence, an RF amplifier is included in the active path for amplitude matching, a delay line 318 is included in the passive path to compensate for the active path's group delay, and a four-quadrant vector interpolator 320 is included in the active path for precise cancellation. FIG. 4 shows the simulated transfer function of the filter shown in FIG. 3 when set for a 1 GHz center frequency when the active path is configured for cancellation at this frequency. These results confirm the proof of concept.

AMBIR filter extensions and modifications. The basic AMBIR Filter can be modified in numerous ways to realize improved performance and/or enhanced functionality. The AMBIR Filter IC can have enhanced functionality by providing tunable bandwidth and Q-factor. To realize programmable filter functions, active baseband filter implementations can be utilized (e.g., op-amp based) which are up-converted through the N-path topology and linearized through the AMBIR topology. This provides tunable bandwidth, center frequency, and Q factor. The AMBIR Filter IC can have reduced size and/or reduced insertion loss through compact power splitting/combining implementations with unequal power splitting/combining. The AMBIR Filter IC can have reduced size and/or power consumption through incorporation of the gain within the active baseband filter and replacing the active RF phase shifter with tunable passive delay lines.

The following paragraphs describe these approaches in more detail.

Enhancing the functionality through active baseband filter implementation: In the AMBIR filter shown in FIG. 3, the N-path filter incorporates a bank of simple series capacitors to realize a high-pass function, which, when translated to RF, results in a 2nd-order notch response. To achieve selectable bandwidth and filter order, active baseband filter implementations can be utilized, such as Gm-C or biquadratic implementations.

Figure 5:
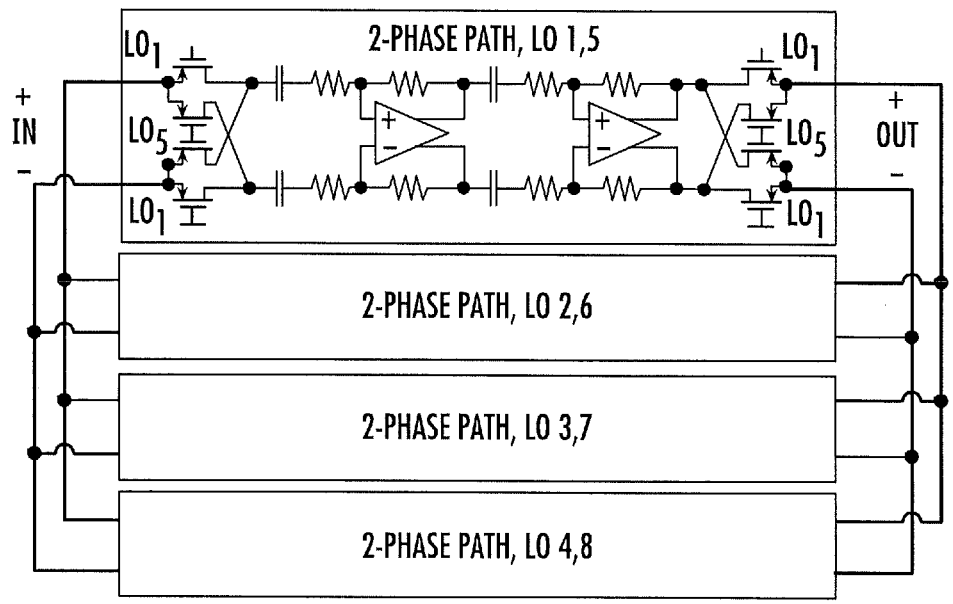
FIG. 5 is a simplified schematic of an active N-path notch filter, using behavioral models for the op-amps.

FIG. 5 shows a simplified schematic of an active N-path notch filter, using behavioral models for the op-amps. The circuit includes a passive mixer driven by LO signals 1 through 8 which downconverts the input signal to a low frequency. These low-frequency signals are then high-pass filtered through a chain of series capacitors and active fully-differential amplifiers. The low-frequency output is then upconverted to desired frequency through another passive mixer driven by LO signals 1 through 8. As with the embodiment illustrated in FIG. 3, in FIG. 5, wideband tuning can be achieved by adjusting the frequency of the local oscillator, which changes the frequency of the signals $LO_1$-$LO_8$ illustrated in FIG. 5. In addition, instead of using a bank of capacitors between the input and input and output switches of each of the N paths, each path in the N path notch filter illustrated in FIG. 5 includes a pair of op-amps connected in series between the input and output switches. As stated above, the op-amps provide tunable bandwidth, center frequency, and Q factor.

Figure 6:
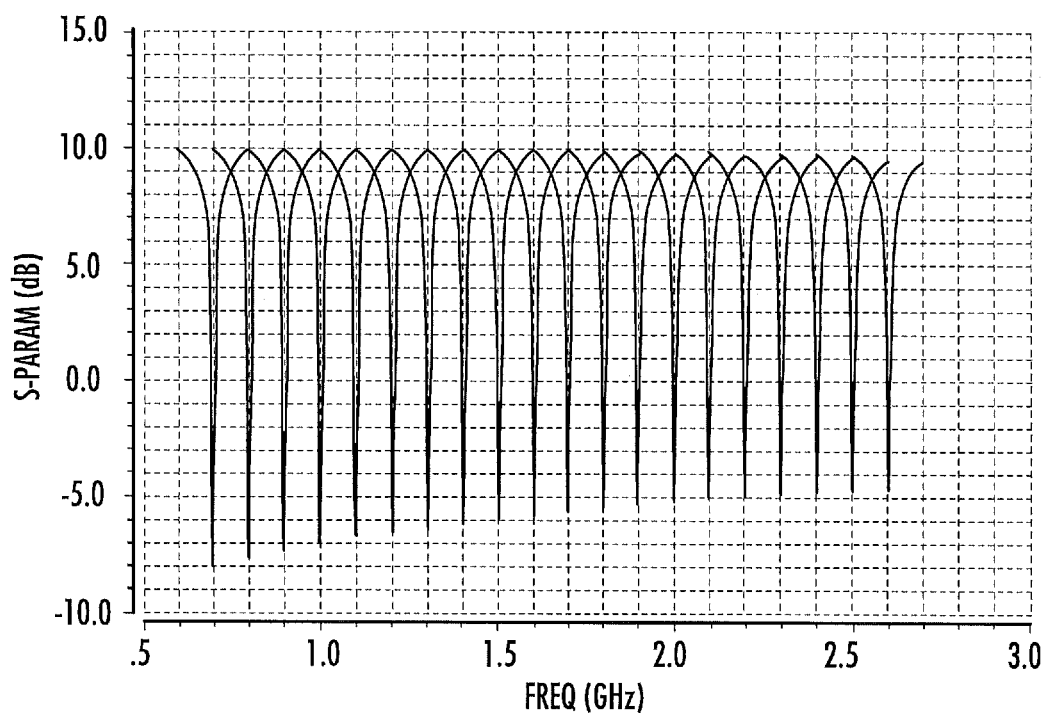
FIG. 6 is a graph showing the simulated transfer function of the filter shown in FIG. 5 for clock frequencies swept from 0.7 to 2.6 GHz.

FIG. 6 is a graph showing the simulated transfer function of the filter shown in FIG. 5 for clock frequencies swept from 0.7 to 2.6 GHz. The filter has been chosen to achieve 10 dB gain to illustrate the ability of this topology to eliminate the separate RF amplifier preceding the N-path filter, where the required gain would be that to equalize the out-of-band responses between passive and active paths.

Figure 7:
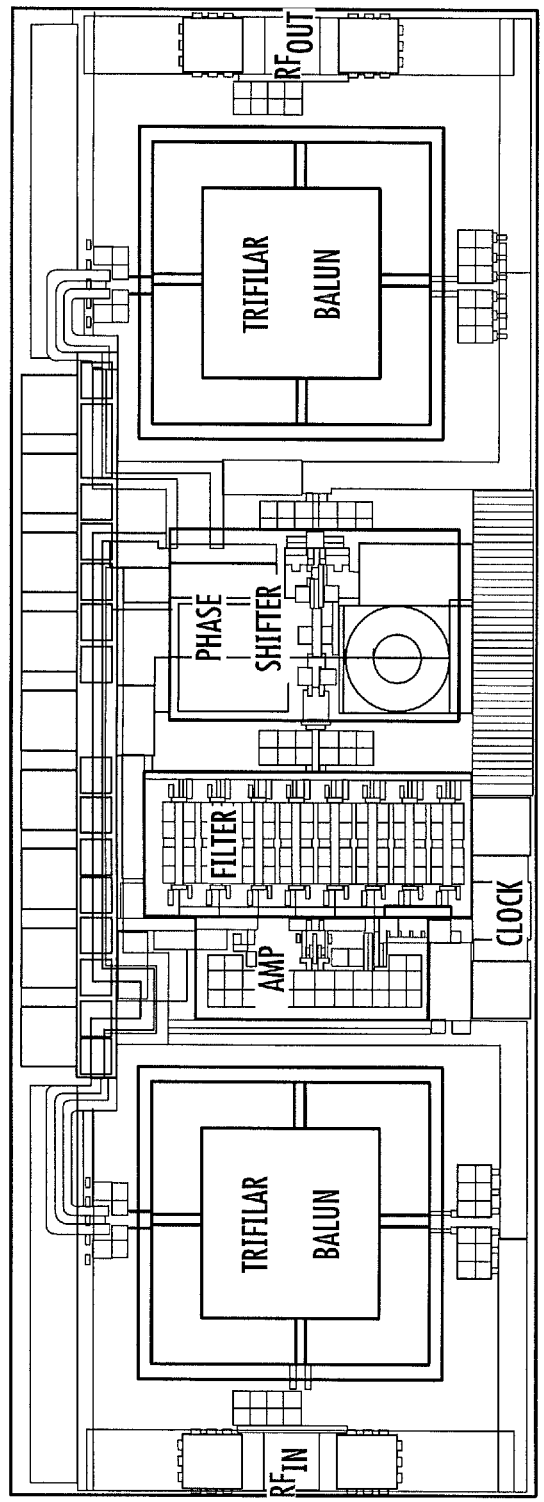
FIG. 7 illustrates a chip layout for an AMBIR filter according to an embodiment of the subject matter described herein.

Reducing the power and area of the filter. FIG. 7 illustrates a chip layout for an AMBIR filter according to an embodiment of the subject matter described herein. The initial proof-of-concept design shown in FIG. 7 consumes 2.8 $mm^2$ area and 90 mW power at 2 GHz, where clock power depends on frequency. Though the single-chip footprint can replace many stand-alone SAW filters, it is desirable to reduce the area to save cost. Towards this end, the output balun can be replaced with a non-isolating T-junction, reducing size by ~30%. This is similar to how Doherty amplifiers are power combined at their outputs [DOH36]; however, the lack of isolation between the two paths requires the output impedance of the active path to be high in band which may restrict the tuning. Second, the phase shifter can be eliminated and their function instead realized using a tunable delay line in the passive path [NAT07], [LAR09]. Third, as mentioned above, through the use of active baseband filters, the RF amplifier can be eliminated.

FIG. 8 is a circuit diagram illustrating an AMBIR filter according to another embodiment of the subject matted described herein. The input signal IN is split and directed to passive and active paths. The passive path comprises a tunable delay line whereas the active path comprises an N-path filter with active baseband filter and amplifier. The filter response in the active path is subtracted from the response in the delayed passive path to create a linearized inverted filter response. For example, a notch response in the active path becomes a bandpass response for the complete filter. As with the previous embodiments, the N-path filter illustrated in FIG. 8 can be tuned by adjusting the local oscillator frequency, which changes the frequency of the signals $LO_1$-$LO_8$ illustrated in FIG. 8.

FIG. 9 is a circuit diagram illustrating a reflective-type AMBIR topology according to another embodiment of the subject matter described herein. This topology would replace both baluns, merging the power splitting and combining functions into a single 90° hybrid coupler.

Figure 9A:
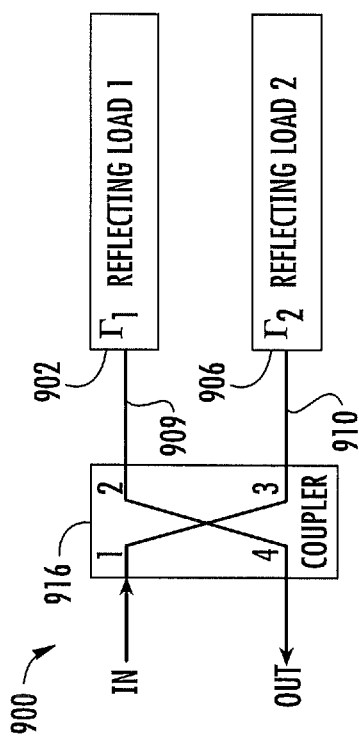
FIGS. 9A-9C are circuit diagrams illustrating a reflective-type AMBIR topology according to another embodiment of the subject matter described herein.
Figure 9C:
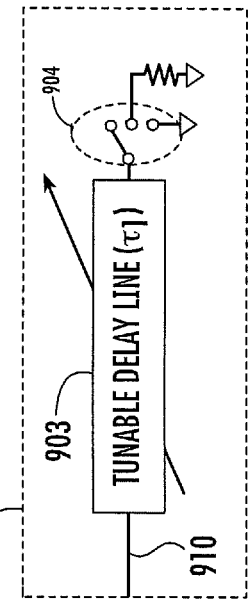
Figure 9B:
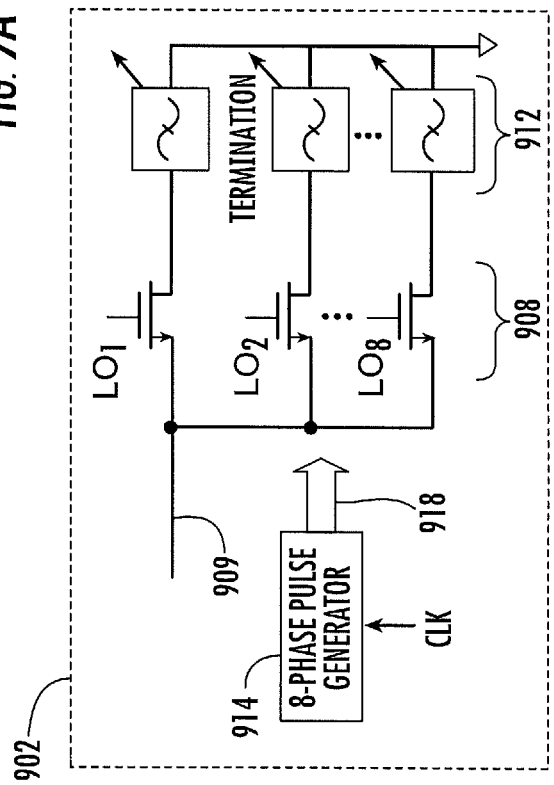

In the embodiment illustrated in FIG. 9A, filter 900 includes a first reflecting load 902, a second reflecting load 906, and a 90-degree hybrid coupler 916. As shown in FIG. 9B, the first reflecting load 902 is comprised of an N path terminated filter having a plurality of switching devices 908 for selectively connecting an input 909 to ground through at least one of a plurality of active termination devices 912. In the embodiment illustrated in FIG. 9B, reflecting load 902 includes an 8-path terminated filter, but other values of N could be used, N being an integer greater than 0. In one embodiment, 902 includes a controller 914 includes an N-phase pulse generator for controlling the plurality of switching devices 908 via control signals 918 sent to control terminals of the plurality of switching devices 908.

The second reflecting load 906 can be implemented either as another N-path reflecting load 902 or as a tunable delay line 907. As shown in FIG. 9C, the tunable delay line 907 comprises a first end and a second end, the second end being connected to a termination circuit 904 for selectively terminating the second end of the delay line to an open circuit, to a short circuit to ground, or to an impedance to ground.

Filter 900 includes a coupler 916 couples a filter input signal IN to both the input of a first reflecting load 902 and the input of a second reflecting load 906, and also couples the input of a first reflecting load 902 and the input of a second reflecting load 906 to a filter output signal OUT. Coupler 916 combines a signal reflection from reflecting load 902 with a signal reflection from reflecting load 906 to produce a filtered output signal OUT having a desired frequency response.

In the embodiment illustrated in FIG. 9, the input signal IN is applied to port 1 of coupler 916. Half the signal appears at port 2 with 90° phase shift and half appears at port 3 with 180° phase shift. A first reflecting load 902, is attached to the through port (port 2) having a reflection coefficient $\Gamma_1(\omega)$ and a second reflecting load 906, is attached to the coupled port (port 3) having a reflection coefficient $\Gamma_2(\omega)$. It can be shown that the output signal is proportional to $\Gamma_1+\Gamma_2$, whereas the signal returned to the input is proportional to $\Gamma_1-\Gamma_2$. By correctly designing $\Gamma_1$ and $\Gamma_2$, an AMBIR cancellation response can be achieved. As with the previous embodiments, the N-phase active filter illustrated in FIG. 9 can be tuned by adjusting the local oscillator frequency, which changes the frequency of the signals $LO_1$-$LO_8$ illustrated in FIG. 9.

Enhancing the Electrical Performance of the Filter. To reduce insertion loss, unequal power splitting in the balun(s) can be used. For example, referring to FIG. 1, 90% of the signal can be fed to the passive path and 10% fed to the active path. Since the active path has gain, the two paths can be equalized to achieve good out-of-band cancellation. In-band, the loss is now much less since we have not thrown away half of the input power into the active path.

To improve out-of-band cancellation, the delay between the active and passive bands must be matched. To reduce the delay in the active path, both the RF amplifier and the RF phase shifter can be eliminated and replaced with the gain in the active baseband filter and a tunable passive delay line in the passive path, respectively. In so doing, the group delay will be reduced, allowing the on-chip delay line to be a reasonable length for integration (<2 mm) such that both the active and passive paths can have approximately equal group delay. With equal group delays, wideband cancellation can be achieved with the rejection dictated by the exact amplitude and phase matching. Our simulations of the active baseband filter implementation show much lower group delay (200 ps).

It should be noted that, although most of the examples above describe the principles of operation of an N-path filter that functions as a band-stop filter, the subject matter described herein is not so limited and may also apply to the use of an N-path filter that implements a high-pass, low-pass, bandpass, or bandstop function, as well as to the use of multiple N-path filters in parallel and/or series to further shape the filter response. The multiple N-path filters may perform the same or different filter functions.

It will be understood that various details of the subject matter described herein may be changed without departing from the scope of the subject matter described herein. Furthermore, the foregoing description is for the purpose of illustration only, and not for the purpose of limitation.

REFERENCES

The disclosures of all of the references listed herein are hereby incorporated by reference in their entireties.

[ABO10] Abouzied, A., "An integrated SAW-less narrowband F front end," 53$^{rd}$ Midwest Symp Cir and Sys 2010:664-7.

[AND10] C. Andrews and A. C. Molnar, "Implications of passive mixer transparency for impedance matching and noise figure in passive mixer-first receivers," IEEE Trans. Circuits and Systems-I, vol. 57, no. 12, pp. 3092-3103, December 2010.

[ANG08] Angier, R. "Tunable RF Filters: Pursuing the holy grail of filter R&D." http://mwjournal/expertadvice/tunable_RF_filters_pursuing_holy_grail_acoustic_filter_/RES_125/.

[BOL11] Bolton, J. 2011. "Mobile Device RF Front End TAM analysis and forecast". CS ManTech Conference, May 16, 2011.

[CRO10] Cross. "MEMS for secure RFID" Crebrex Technologies SBIR Phase II report. FCC11.

[DAR07] Darabi "A blocker filter technique for SAW-less receivers" IEEE Solid State Circuits 2007 (42):2766-73.

[FLO08] B. Floyd, "A 16 to 18.8-GHz sub-integer-N frequency synthesizer for 60-GHz transceivers," IEEE J. Solid-State Circuits, vol. 43, no. 5, pp. 1076-1086, May 2008.

[FRA60] L. E. Franks and I. W. Sandberg, "An alternative approach to the realizations of network functions: N-path filter," Bell Syst. Tech. J., pp. 1321-1350, 1960.

[GAR11] Gartner "Smartphone shipments up 42 percent in Q3 2011" www.gartner.com.

[GHA11] A. Ghaffari, E. A. M. Klumperink, M. C. M. Soer, and B. Nauta, "Tunable high-Q Npath band-pass filters: modeling and verification," IEEE J. Solid-State Circuits, vol. 46, no. 5, pp. 998-1010, May 2011.

[HAL10] Hall 2010 "Bulk acoustic resonators with multi-layer electrodes" U.S. Pat. No. 7,768,364.

[HIL08] Hilvert "Radio Frequency MEMS for Wireless Communications" IEEE Magazine August pp 68-74.

[HU10] Hu "A wide tuning digitally controlled FBAR-based oscillator for frequency synthesis." Int Freq Cont Symp (FCS) 2010: 608-12.

[LAR09] Larsen "Film bulk acoustic resonator (FBAR) devices with temperature compensation" U.S. Pat. No. 7,561,009.

[LON00] J. R. Long, "Monolithic transformers for silicon RF IC design," IEEE J. Solid-State Circuits, vol. 35, no. 9, pp. 1368-1382, September 2000.

[MEE10] Meeker, M "Internet Trends" Morgan Stanley Investor Conference, NY, April 2010 MI10 Mi. "MEMS tunable bandpass filter on high-k LTCC" 23rd Int. Conf MEMS 2010:787090.

[MIR11] A. Mirzaei and H. Darabi, "Analysis and imperfections on performance of 4-phase passive-mixer-based high-Q bandpass filters in SAW-less receivers," IEEE Trans. Circuits and Systems-I, vol. 58, no. 5, pp. 879-892, May 2011.

[MIR12] A. Mirzaei, H. Darabi, and D. Murphy, "Architectural evolution of integrated M-phase high-Q bandpass filters," IEEE Trans. Circuits and Systems-I, vol. 59, no. 1, January 2012.

[MOR09] Morris, A S "Micro-electromechanical systems (MEMS) variable capacitors and actuator components and related methods" U.S. Pat. No. 7,545,622.

[MOT10] Motokai "Filter, duplexer and communications apparatus" US Patent Application 2010/0148888.

[NAT11] A. Natarajan, S. Reynolds, M.-D. Tsai, S. Nicolson, J.-H. C. Zhan, D. Kam, D. Liu, O. Huang, A. Valdes-Garcia, and B. A. Floyd, "A fully-integrated 16-element phased-array receiver in SiGe BiCMOS for 60-GHz communications," IEEE J. Solid-State Circuits, vol. 46, no. 5, pp. 1059-1-75.

[NAV10] Navian Co. RF Device Module for Cellular 2009-2010 www.navian.co.jp.

[REI09] Reines and Rebeiz "Cascadable RF MEMS switched capacitors for 0.1 to 2 GHz applications" Microwave Symp Digest 2009:1157-60.

[SEN06] Sengupta 2006 "Electronically tunable filters with dielectric varactors" U.S. Pat. No. 7,145,415.

[SID11] Sideco, F "Smartphones will account for majority of shipments in 2015" IHS iSupply report.

[TSA09] M. D. Tsai and A. Natarajan, "60 GHz passive and active RF-path phase shifters in silicon," EEE RFIC Symp. Dig. Papers, June 2009, pp. 223-226.

[VYE10] Vye, D. "Perspectives on Mobile Device Front-end integration" MW Jour Sep. 12, 2010.

[WU06] Wu "MEMS tunable capacitor based on angular vertical comb drives" U.S. Pat. No. 7,085,122.

[WER10] Werth "System design considerations for SAW-less front end and example of GSM DCS1088" 53rd Mid-West Symp Circ and Sys: 2010:664-7.

[YOS10] "Acoustic surface wave filter module and method for manufacturing the same" U.S. Pat. No. 7,692,513.

What is claimed is:

1. A tunable transmissive filter, comprising:
a splitter for splitting an input signal into a first signal and a second signal;
a first modifier circuit for modifying a characteristic of the first signal to produce a modified first signal;
a second modifier circuit for using feedforward cancellation to modify a characteristic of the second signal to produce a modified second signal, the second modifier circuit including an N-path filter, N being an integer greater than 0, the N-path filter having a desired frequency response, wherein the N-path filter includes a first N-phase passive mixer, a baseband filter for implementing a desired filter response, and a second N-phase passive mixer, and wherein the baseband filter comprises a plurality of active baseband networks between the first and second passive mixers to realize the desired filter response; and
a combiner for combining the modified first signal and the modified second signal to produce a filtered output signal having a desired inverted frequency response.

2. The filter of claim 1 wherein the splitter comprises a balun.

3. The filter of claim 1 wherein the splitter provides equal power to the first and second signals.

4. The filter of claim 1 wherein the splitter provides unequal power to the first and second signals.

5. The filter of claim 1 wherein the first modifier circuit comprises a passive path and wherein the second modifier circuit comprises an active path.

6. The filter of claim 5 wherein the active path includes an amplifier and wherein the splitter provides more power to the passive path than to the active path.

7. The filter of claim 1 wherein the first modifier circuit comprises at least one of:
a tunable passive delay line;
a tunable active delay line; and
a phase shifter.

8. The filter of claim 1 wherein each of the active baseband networks comprises a pair of op-amps connected in series.

9. The filter of claim 1 wherein the desired filter response comprises a low-pass response, a high-pass response, a bandpass response, or a bandstop response.

10. The filter of claim 1 wherein the second modifier circuit includes at least one of:
an RF amplifier;
an RF limiter;
a differential quadrant generator; and
a phase shifter.

11. The filter of claim 1 wherein the combiner comprises at least one of:
a balun;
a non-isolating T junction;
a passive summing circuit;
an active summing circuit.

12. A tunable reflective filter, comprising:
a first reflecting load comprising an N path terminated filter having a plurality of switching devices for selectively connecting an input to ground through at least one of a plurality of active termination devices, N being an integer greater than 0;
a second reflecting load; and
a coupler for coupling a filter input signal to the input of the first reflecting load and to the input of the second reflecting load and for coupling the input of the first reflecting load and the input of the second reflecting load to a filter output signal,
wherein the coupler uses feedforward cancellation to combine a signal reflection from a delay line with a signal reflection from the terminated filter to produce a filtered output signal having a bandpass response.

13. The filter of claim 12, wherein the second reflecting load comprises a second N path terminated filter having a plurality of switching devices for selectively connecting an input to ground through at least one of a plurality of active termination devices, N being an integer greater than 0, and wherein the coupler is a 90-degree hybrid coupler.

14. The filter of claim 12, wherein the second reflecting load comprises a tunable delay line having a first end and a second end, the second end being connected to a termination circuit for selectively terminating the second end of the delay line to an open circuit, to a short circuit to ground, or to an impedance to ground.

15. The filter of claim 14 comprising a controller for controlling at least one of:
the plurality of switching devices;
the active termination devices; and
the termination circuit.

16. The tunable filter of claim 15 wherein the controller comprises an N phase pulse generator for controlling the plurality of switching devices via control signals to control terminals of the plurality of switching devices.

17. A method for tunable transmissive filtering, comprising:
splitting an input signal into a first signal and a second signal;
modifying a characteristic of the first signal to produce a modified first signal;
using feedforward cancellation to modify a characteristic of the second signal to produce a modified second signal, including using an N-path filter, N being an integer greater than 0, wherein using the N-path filter includes using a first N-phase passive mixer, a baseband filter, and a second N-phase passive mixer, and wherein using the baseband filter comprises using a plurality of active baseband networks between the first and second passive mixers; and
combining the modified first signal and the modified second signal to produce a filtered output signal having a desired frequency response.

18. The method of claim 17 wherein splitting the input signal comprises splitting the input signal using a balun.

19. The method of claim 17 wherein the first and second signals are of equal power.

20. The method of claim 17 wherein the first and second signals are of unequal power.

21. The method of claim 17 wherein a characteristic of the first signal is modified using a passive path and wherein a characteristic of the second signal is modified using an active path.

22. The method of claim 21 wherein the active path includes an amplifier and wherein the splitter provides more power to the passive path than to the active path.

23. The method of claim 17 wherein a characteristic of the first signal is modified using at least one of:

a tunable passive delay line;
a tunable active delay line; and
a phase shifter.

24. The method of claim 17 wherein each of the active baseband networks comprises a pair of op-amps connected in series.

25. The method of claim 17 wherein a characteristic of the second signal is modified using at least one of:
an RF amplifier;
an RF limiter;
a differential quadrant generator; and
a phase shifter.

26. The method of claim 17 wherein combining the modified first and second signals comprises using at least one of:
a balun;
a non-isolating T junction;
a passive summing circuit;
an active summing circuit.

27. A method for tunable reflective filtering, comprising:
providing, via a coupler, a filter input signal to an input of a first reflecting load and to an input of a second reflecting load and coupling the input of the first reflecting load and the input of the second reflecting load to a filter output signal, the first reflecting load comprising an N path terminated filter having a plurality of switching devices for selectively connecting an input to ground through at least one of a plurality of active termination devices, N being an integer greater than 0;
using feedforward cancellation to combine a signal reflection from a delay line with a signal reflection from the terminated filter to produce a filtered output signal having a bandpass response.

28. The method of claim 27, wherein the second reflecting load comprises a second N path terminated filter having a plurality of switching devices for selectively connecting an input to ground through at least one of a plurality of active termination devices, N being an integer greater than 0, and wherein the coupler is a 90-degree hybrid coupler.

29. The method of claim 27, wherein the second reflecting load comprises a tunable delay line having a first end and a second end, the second end being connected to a termination circuit for selectively terminating the second end of the delay line to an open circuit, to a short circuit to ground, or to an impedance to ground.

30. The method of claim 29 comprising using a controller to control at least one of:
the plurality of switching devices;
the active termination devices; and
the termination circuit.

31. The method of claim 30 wherein the controller uses an N phase pulse generator to controlling the plurality of switching devices via control signals to control terminals of the plurality of switching devices.

32. A non-transitory computer readable medium having stored thereon executable instructions that when executed by the processor of a computer control the computer to perform steps comprising:
splitting an input signal into a first signal and a second signal;
modifying a characteristic of the first signal to produce a modified first signal;
using feedforward cancellation to modify a characteristic of the second signal to produce a modified second signal, including using an N-path filter, N being an integer greater than 0, wherein using the N-path filter includes using a first N-phase passive mixer, a baseband filter, and a second N-phase passive mixer, and wherein using the baseband filter comprises using a plurality of active baseband networks between the first and second passive mixers; and
combining the modified first signal and the modified second signal to produce a filtered output signal having a desired frequency response.

33. A non-transitory computer readable medium having stored thereon executable instructions that when executed by the processor of a computer control the computer to perform steps comprising:
providing, via a coupler, a filter input signal to an input of a first reflecting load and to an input of a second reflecting load and coupling the input of the first reflecting load and the input of the second reflecting load to a filter output signal, the first reflecting load comprising an N path terminated filter having a plurality of switching devices for selectively connecting an input to ground through at least one of a plurality of active termination devices, N being an integer greater than 0;
using feedforward cancellation to combine a signal reflection from a delay line with a signal reflection from the terminated filter to produce a filtered output signal having a bandpass response.

* * * * *